(12) United States Patent
Zhao et al.

(10) Patent No.: US 10,287,083 B2
(45) Date of Patent: May 14, 2019

(54) LIQUID-CRYSTAL-GLASS PACKING CASE AND A MOISTURE-PROOF PACKING STRUCTURE

(71) Applicant: Shenzhen China Star Optoelectronics Technology Co., Ltd., Shenzhen, Guangdong (CN)

(72) Inventors: Zhilin Zhao, Guangdong (CN); Shihhsiang Chen, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 802 days.

(21) Appl. No.: 14/426,385

(22) PCT Filed: Oct. 23, 2014

(86) PCT No.: PCT/CN2014/089311
§ 371 (c)(1),
(2) Date: Mar. 5, 2015

(87) PCT Pub. No.: WO2016/061792
PCT Pub. Date: Apr. 28, 2016

(65) Prior Publication Data
US 2016/0244236 A1  Aug. 25, 2016

(30) Foreign Application Priority Data
Oct. 20, 2014 (CN) .......................... 2014 1 0559106

(51) Int. Cl.
*B65D 81/26* (2006.01)
*B65D 85/48* (2006.01)
(Continued)

(52) U.S. Cl.
CPC .......... *B65D 81/263* (2013.01); *B65D 71/04* (2013.01); *B65D 81/26* (2013.01); *B65D 85/48* (2013.01);
(Continued)

(58) Field of Classification Search
CPC ...... B65D 81/263; B65D 85/48; B65D 81/02; B65D 81/05; B65D 81/053; H01L 21/67363; H01L 21/67369
(Continued)

(56) References Cited

U.S. PATENT DOCUMENTS 4,666,479 A * 5/1987 Shoji ................. H01L 21/67366
  206/454
4,875,595 A * 10/1989 Van Valkenburg .... B65D 88/12
  206/386

(Continued)

*Primary Examiner* — Robert Poon
(74) *Attorney, Agent, or Firm* — Andrew C. Cheng

(57) ABSTRACT

A liquid-crystal-glass packing case comprises a case body, which includes a bottom and side walls integrated connecting around the bottom, wherein, a filter screen assembly is fixed on the case body, and the case body is capable of communicating inside and outside by the filter screen assembly. Wherein, a slot is disposed at a gap arranged on the side walls, and the filter screen assembly is interposed in the slot. Also, a hole slot is penetrating from the side walls of the case body to the bottom, and the filter screen assembly is interposed in the hole slot to provide solid supporting efficiency. The invention also provides a moisture-proof packing structure. The invention overcomes a prejudice of moisture-proof and sealing from people, provides a thought of putting into and dispersing out, and applies a utility of liquid-crystal-glass packing case and moisture-proof packing structure to get a better moisture-proof efficiency.

2 Claims, 4 Drawing Sheets

(51) Int. Cl.
  *H01L 21/673* (2006.01)
  *B65D 71/04* (2006.01)
(52) U.S. Cl.
  CPC .. *H01L 21/67363* (2013.01); *H01L 21/67389* (2013.01)
(58) Field of Classification Search
  USPC .................. 206/499, 597, 454, 504, 386
  See application file for complete search history.

(56) References Cited

U.S. PATENT DOCUMENTS

| | | | | |
|---|---|---|---|---|
| 5,476,176 | A * | 12/1995 | Gregerson | H01L 21/67376 141/98 |
| 6,044,974 | A * | 4/2000 | Webb | B65D 65/44 206/386 |
| 7,773,198 | B2 * | 8/2010 | Phillips | G03B 27/42 206/455 |
| 8,727,119 | B2 * | 5/2014 | Hsiao | B65D 85/48 206/454 |
| 2005/0006266 | A1 | 1/2005 | Kurikawa | |
| 2011/0284423 | A1 * | 11/2011 | Huang | G03F 1/64 206/710 |

* cited by examiner

LIQUID-CRYSTAL-GLASS PACKING CASE AND A MOISTURE-PROOF PACKING STRUCTURE

FIELD OF THE INVENTION

The invention relates to a packing technical field, particularly to a liquid-crystal-glass packing case and a moisture-proof packing structure.

BACKGROUND OF THE INVENTION

There are various kinds of packing methods of liquid crystal glass at panel industry at present, and in order to dispose liquid crystal glasses on a plate of cushion materials mostly made by foam molding or also hard boxes applied by injection/blowing molding.

The packing method applied thereto are basically sealing method, that is, there is no obvious spaces after stacking every case box. The whole stacking boxes are tied up by wrapping film around, and a water-proof film is added to top of the stacking boxes. There is no special sealing to spaces between case boxes and a small amount of air can flow in and out. Furthermore, both peripheral wrapping film and the top cover film have certain moisture permeabilities. However, vapor or even droplets is existed inside wrapping film or even inside case box after transportation in a container caused by two reasons: firstly, steam of high moisture environment enter through outer protective layer and top cover film; secondly, steam in the air is condensed into droplets existed in the packages due to different temperatures from different environments.

Industries try various methods in order to solve the problem described above, ex: complete sealing to packages, sealing by alumina bags, composite bags or packages with materials of extra-low moisture permeable rates; adding desiccants; adding paper peripheral card and etc. after stacking packing cases. After storing examination of 240 hours, 60 and 75% RH, the third method of the three methods mentioned above is the best one. The basic conclusion is: the main reason of water producing is different temperatures, the moisture-proof effect of desiccants is very normal, and it is meaningless to prevent steam from entering packing cases; on the contrary, paper box can be used to prevent part of steam from entering therein because of the character of absorbing vapor easily, and steam inside the packages goes out effectively.

SUMMARY

The invention provides a packing case for liquid crystal glass to overcome the defect described above, and the liquid-crystal-glass packing case comprises a case body, which includes a bottom and side walls integrated connecting around the bottom, wherein, a filter screen assembly is fixed on the case body, and the case body is capable of communicating inside and outside by the filter screen assembly.

Wherein, a slot is disposed at a gap arranged on the side walls, and the filter screen assembly is interposed in the slot.

Wherein, the filter screen assembly comprises a frame and filter screens fixed and connected within the frame.

Wherein, a through hole is disposed within a sink hole arranged on the bottom, and the filter screen assembly is embedded in the sink hole.

Wherein, the filter screen assembly comprises a frame and filters screen fixed and connected within the frame.

Wherein, a hole slot is penetrating from the side walls of the case body to the bottom, and the filter screen assembly is interposed in the hole slot.

Wherein, the filter screen assembly is a cylindrical body to match the hole slot, the screen filters are disposed at top and bottom openings of the cylindrical body, a opening is disposed at a side wall facing to the case body in the cylindrical body, and the filter screens is fixed at the opening.

Wherein, there are four groups of filter screen assemblies disposed at two corresponding sides of the side walls respectively.

A purpose of the invention also provides a moisture-proof packing structure, wherein, comprising multiple liquid-crystal-glass cases, stacking multiple liquid-crystal-glass cases with a top cover disposed on a top layer after disposing and stacking liquid crystal glasses in the liquid-crystal-glass cases, and then disposing in a carton.

Wherein, a filter screen is disposed on a through hole arranged on the top cover.

The beneficial effects of the invention: the invention overcomes a prejudice of moisture-proof and sealing from people, provides a thought of putting into and dispersing out, and applies a utility of liquid-crystal-glass packing case and moisture-proof packing structure to get a better moisture-proof efficiency.

DETAILED DESCRIPTION OF THE EMBODIMENTS

References are made to detailed descriptions set forth hereinafter in conjunction with figures.

Embodiment 1

Figure 1:
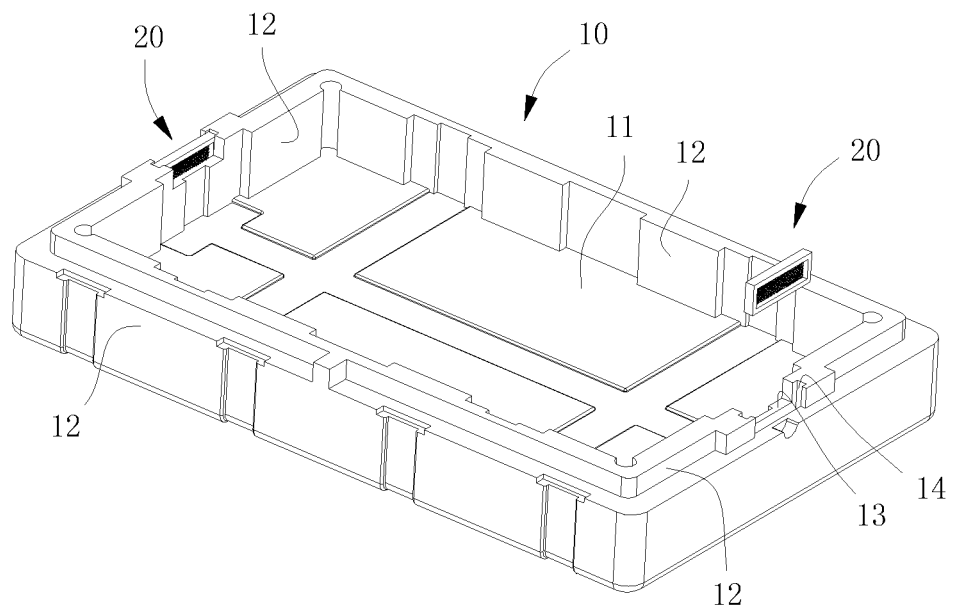
FIG. 1 is a structural schematic view of a liquid-crystal-glass packing case according to an embodiment 1 of the invention.
Figure 2:
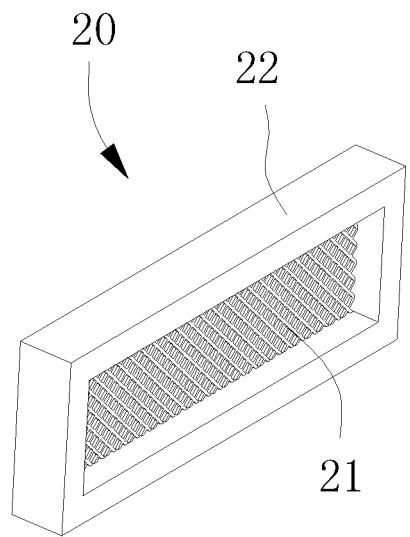
FIG. 2 is a structural schematic view of a filter screen assembly according to the embodiment 1 of the invention.
Figure 3:
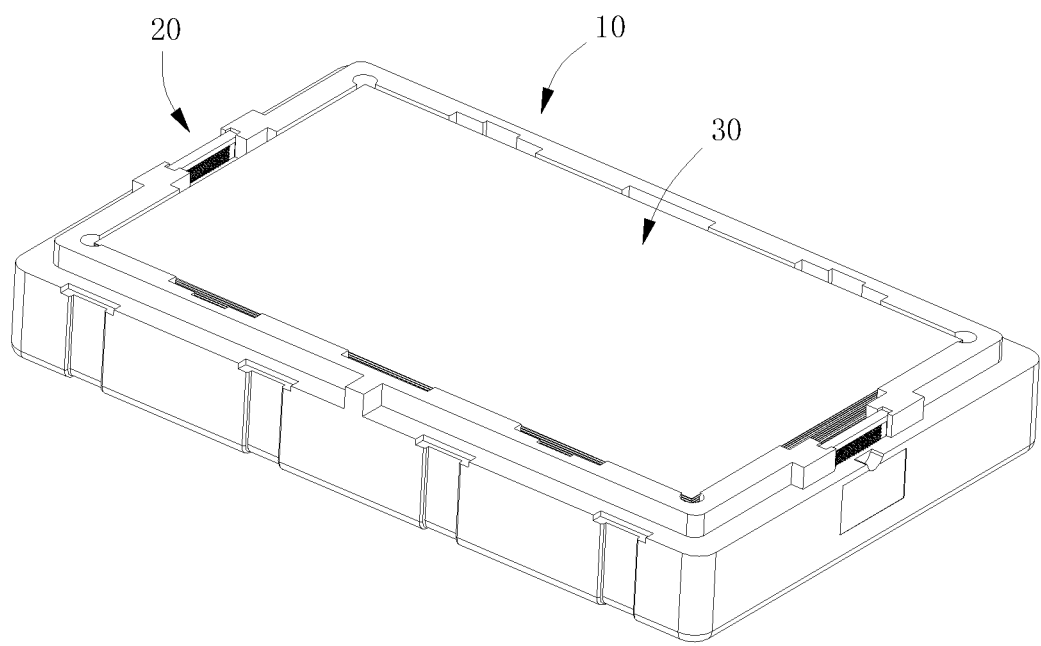
FIG. 3 is a schematic view of stacking liquid crystal glasses into the liquid-crystal-glass packing case according to an embodiment 1 of the invention.

Refer to FIG. 1, this liquid-crystal-glass packing case comprises a case body 10, which includes a bottom 11 and side walls 12 integrated connecting around the bottom to have a space disposing liquid crystal glasses in the middle, and in order to ventilating inside and outside of case boxes 10 after stacking multiple case boxes 10, a filter screen assembly 20 is fixed on the case body 10. This connecting method of the filter screen assembly 20 and case box 10 is as figures shown that slots 14 are disposed at both sides of a gap 13 arranged on the side wall 12 of the case box 10, and the filter screen assembly 20 is interposed into the slot 14;

the filter screen assembly 20 comprises a frame 21 and a filter screen 22 fixed and connected within the frame to communicate inside and outside of the case box 10 via the filter screen 22 in order to ventilating, and simultaneously in order to prevent huge particles, like dust, pollens and etc., from entering the case boxes 10 to pollute the liquid crystal glasses, requiring filter screen 22 being applying materials of nylon, plastics and etc. to manufacture filter screen of dense mesh, and shown in FIG. 2. And then refer to FIG. 3, after disposing liquid crystal glass 30 into the case box 10, air ventilation inside and outside can be maintained via the filter screen assembly 20.

Embodiment 2

Figure 4:
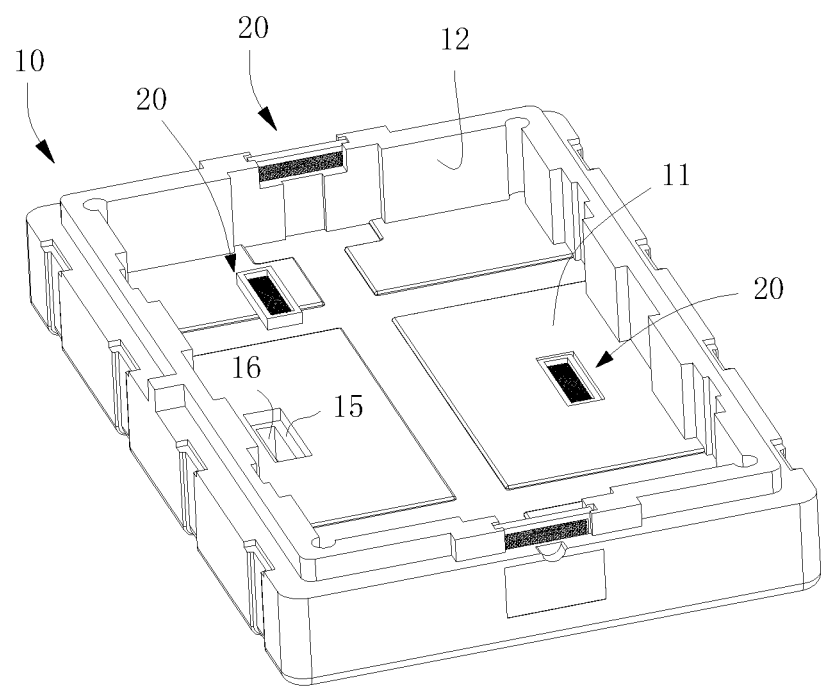
FIG. 4 is a structural schematic view of a liquid-crystal-glass packing case according to an embodiment 2 of the invention.

As shown in FIG. 4, this embodiment is distinguished from the embodiment 1 that the filter screen assembly 20 is also disposed on the bottom 11 of the case box 10, a through hole 16 is disposed within a sink hole 15 arranged on the bottom 11, the filter screen assembly 20 is embedded in the sink hole 15, and a top surface of the filter screen assembly 20 is at the same plane with the bottom 11 of the case box. Wherein, the standard of the filter screen assembly is the same as the filter screen assembly 20 on the side walls 12 to change each other.

Embodiment 3

Figure 5:
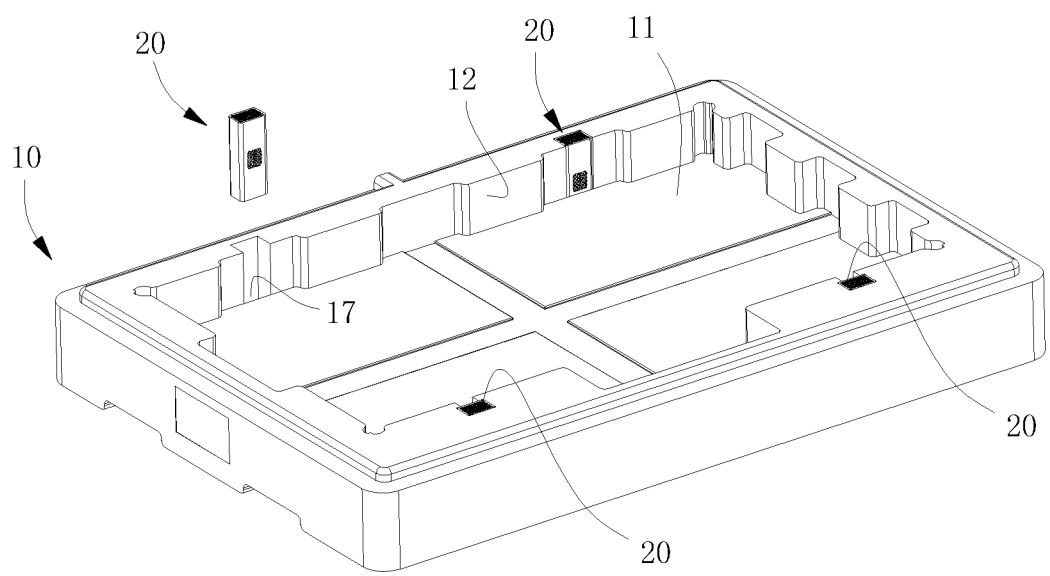
FIG. 5 is a structural schematic view of a liquid-crystal-glass packing case according to an embodiment 3 of the invention.
Figure 6:
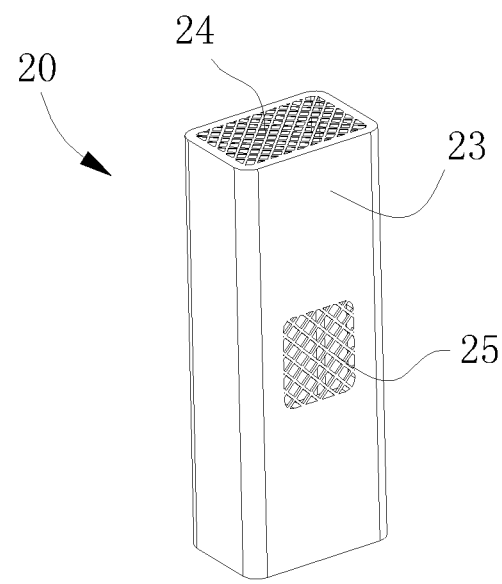
FIG. 6 is a structural schematic view of a filter screen assembly according to the embodiment 3 of the invention.

Considering that the higher the cost pressure gets, the more amount the packages disposes to lower the packing cost of a single liquid crystal glass. Utilizing low dense and low weigh packing cases is still continuing in the industries at present, and the former causes the weight of a single package keeping rising, the latter results the packing cases into lowering rigid strength, and then the case boxes are induced falling in compressive strength and cannot be able to take multiple layers stacking. In order to solve this problem and dispose rigid components into the case boxes to increase the compressive strength of case boxes, the embodiment will combine the rigid component and the filter screen assembly provided by the invention together. Refer to FIG. 5 and FIG. 6, a hole slot 17 is penetrating from the side walls 12 of the case body 10 to the bottom, and the filter screen assembly 20 is interposed in the hole slot 17; wherein the filter screen assembly is a cylindrical body to match the hole slot, the screen filters are disposed at top and bottom openings of the cylindrical body, a opening is disposed at a side wall facing to the case body in the cylindrical body, and the filter screens is fixed at the opening, and then the case boxes 10 stacking from every layer can be connected together by this way; in order to achieve the rigid requirement in packing, there are four groups of filter screen assemblies in this embodiment disposed at two corresponding sides of the respectively side walls of the case box 10, and in order to make better efficiency in ventilation, the top cover of the case box 10 of the top layer can dispose a opening in a vent of the filter screen assembly correspondingly or the same as within a vent with a filter screen, and this structure can be referred in the following embodiment and figure.

Embodiment 4

Figure 7:
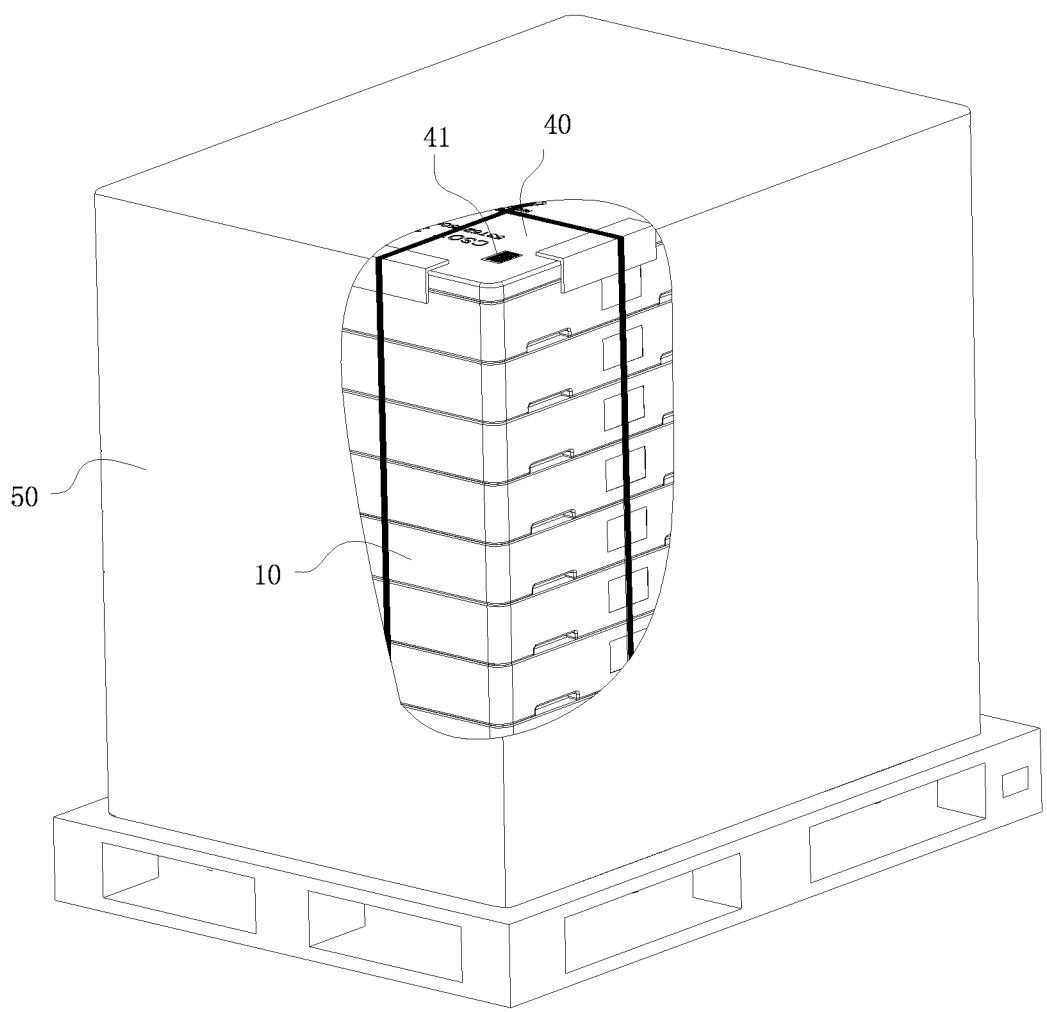
FIG. 7 is a moisture-proof packing structure of an embodiment 4 of the invention.

The invention provides a moisture-proof packing structure, as shown in FIG. 7, stacking multiple liquid-crystal-glass cases 10 with a top cover 40 disposed on a top layer after disposing and stacking liquid crystal glasses in any liquid-crystal-glass cases mentioned above, and then disposing in a carton 50. The filter screen assembly can ventilate inside the case box and filter huge particles polluting the liquid crystal glasses; the carton can work with moisture-proof effect simultaneously; in addition, a filter screen 41 is disposed on a through hole arranged on the top cover corresponding to the filter screen opening on the filter screen assembly in the embodiment 3.

It should be noted that: the above-described embodiments are merely examples of the present invention is made to clearly illustrate, but not limited to the embodiment. Those of ordinary skill in the art that, on the basis of the above description may also be make changes or changes in other different forms, and cannot be exhaustive here without all of the embodiment, and thus come out of the change or changes evident, still in the midst of the scope of the invention.

The invention claimed is:

1. A moisture-proof packing structure, wherein the moisture-proof packing structure comprises a carton, a plurality of liquid-crystal-glass cases and a top cover, the liquid-crystal-glass cases are stacked with the top cover disposed on top of the stacked liquid-crystal glass cases, wherein each of the liquid-crystal-glass cases includes a case body, the case body includes a bottom and a plurality of side walls integrated connecting around the bottom, a filter screen assembly is fixed on the case body, and the case body is capable of communicating inside and outside by the filter screen assembly; wherein a hole slot is penetrating from the side walls of the case body to the bottom, and the filter screen assembly is interposed in the hole slot, the filter screen assembly is a cylindrical body to match the hole slot and comprises a plurality of filter screens, a first one and a second one of the filter screens are disposed at top and bottom openings of the cylindrical body, respectively, an opening is disposed at a side wall facing the case body in the cylindrical body, and a third one of the filter screens is fixed at the opening, wherein the stacked liquid-crystal glass cases and the top cover are disposed in the carton.

2. The moisture-proof packing structure according to claim 1, wherein, four groups of filter screen assemblies are disposed at two corresponding sides of the side walls respectively.

* * * * *